US008278025B2

(12) United States Patent
Ishiduka et al.

(10) Patent No.: US 8,278,025 B2
(45) Date of Patent: Oct. 2, 2012

(54) MATERIAL FOR FORMING RESIST PROTECTION FILMS AND METHOD FOR RESIST PATTERN FORMATION WITH THE SAME

(75) Inventors: Keita Ishiduka, Kawasaki (JP); Kotaro Endo, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 1257 days.

(21) Appl. No.: 11/722,797

(22) PCT Filed: Dec. 22, 2005

(86) PCT No.: PCT/JP2005/023637
§ 371 (c)(1),
(2), (4) Date: Jun. 25, 2007

(87) PCT Pub. No.: WO2006/070695
PCT Pub. Date: Jul. 6, 2006

(65) Prior Publication Data
US 2008/0299503 A1 Dec. 4, 2008

(30) Foreign Application Priority Data
Dec. 27, 2004 (JP) ................................. 2004-378234

(51) Int. Cl.
*G03F 7/004* (2006.01)
*G03F 7/30* (2006.01)
(52) U.S. Cl. ............... 430/273.1; 430/270.1; 430/271.1; 430/326; 430/330; 526/245; 526/282; 526/284
(58) Field of Classification Search ............... 430/271.1, 430/326, 330, 270.1, 273.1; 526/245, 282, 526/284
See application file for complete search history.

(56) References Cited

U.S. PATENT DOCUMENTS

| | | | | |
|---|---|---|---|---|
| 5,432,039 | A * | 7/1995 | Shimokawa et al. | 430/191 |
| 5,814,694 | A | 9/1998 | Watanabe et al. | |
| 5,942,369 | A * | 8/1999 | Ota et al. | 430/192 |
| 6,723,485 | B1 * | 4/2004 | Tsutsumi et al. | 430/270.1 |
| 6,995,222 | B2 * | 2/2006 | Buckanin et al. | 526/242 |
| 7,335,703 | B2 * | 2/2008 | Fukui | 525/245 |
| 7,455,952 | B2 * | 11/2008 | Hatakeyama et al. | 430/273.1 |
| 7,462,439 | B2 * | 12/2008 | Jung et al. | 430/273.1 |
| 7,580,111 | B2 * | 8/2009 | Miyamatsu et al. | 355/53 |
| 2004/0242790 | A1 * | 12/2004 | Fukui | 525/245 |
| 2005/0137355 | A1 * | 6/2005 | Buckanin et al. | 525/374 |
| 2005/0239932 | A1 | 10/2005 | Akiyama et al. | |
| 2005/0250898 | A1 | 11/2005 | Maeda et al. | |
| 2006/0141400 | A1 | 6/2006 | Hirayama et al. | |
| 2006/0142518 | A1 * | 6/2006 | Qiu et al. | 526/319 |
| 2008/0311523 | A1 * | 12/2008 | Endo et al. | 430/287.1 |

FOREIGN PATENT DOCUMENTS

| | | |
|---|---|---|
| JP | H09-506185 | 6/1997 |
| JP | H09-506185 A | 6/1997 |
| JP | H10-69091 A | 3/1998 |
| JP | 11-176727 | 7/1999 |
| JP | 2003-345026 | 12/2003 |
| JP | 2004-037887 | 2/2004 |
| JP | 2004-37887 A | 2/2004 |
| JP | 2004-361557 | 12/2004 |
| JP | 2005-316352 A | 11/2005 |
| JP | 2006-064712 | 3/2006 |
| JP | 2006-070244 | 3/2006 |
| JP | 2006-091798 | 4/2006 |
| JP | 2006-133716 | 5/2006 |
| JP | 2006-146232 | 6/2006 |
| JP | 2006-163345 | 6/2006 |
| JP | 2006-171684 | 6/2006 |
| JP | 2006-184575 | 7/2006 |
| WO | WO 95/10798 | 4/1995 |
| WO | WO 9510798 | 4/1995 |
| WO | WO 2004/074937 | 9/2004 |
| WO | WO 2006/035790 | 4/2006 |
| WO | WO 2006/059555 | 6/2006 |

OTHER PUBLICATIONS

Hoffnagle et al., "Liquid immersion deep-ultraviolet interferometric lithography", Journal of Vacuum Science & Technology B, vol. 17, No. 6, American Society , Nov./Dec. 1999, pp. 3306-3309.
Sato, "TOK Resist & Material Development Status for Immersion Lithography", SEMATECH, Litho Forum, Jan. 27-29, 2004, Los Angeles, California.
M. Switkes et al., "Immersion lithography at 157 nm", Journal of Vacuum Science & Technology B, vol. 19, No. 6, American Vacuum Society, Nov./Dec. 2001, pp. 2353-2356.
M. Switkes et al., "Resolution Enhancement of 157 nm Lithography by Liquid Immersion", Proceedings of SPIE, vol. 4691, 2002, pp. 459-465.
International Search Report PCT/JP2005/023637, Dec. 27, 2005.
Hoffnagle et al., "Liquid immersion deep-ultraviolet interferometric lithography", Journal of Vacuum Science & Technology B, vol. 17, No. 6, American Vacuum Society , Nov./Dec. 1999, pp. 3306-3309.
Sato, "TOK Resist & Material Development Status for Immersion Lithography", SEMATECH, Litho Forum, Jan. 28-29, 2004, Los Angeles, California.
International Search Report PCT/JP2005/023637, Dec. 22, 2005.
Notice of Reasons for Rejection issued to counterpart JP Application No. 2004-378234, mailed Mar. 3, 2009.

* cited by examiner

*Primary Examiner* — John Chu
(74) *Attorney, Agent, or Firm* — Knobbe Martens Olson & Bear LLP

(57) ABSTRACT

The formation of high-resolution resist patterns by liquid immersion lithography with various fluids is enabled by protecting a resist film from deterioration (such as bridging) during the immersion exposure in a fluid (such as water) and the fluid from deterioration and improving the stability of a resist film in the storage after exposure without increase in the number of treatment steps. A material for forming resist protection films which comprises an alkali-soluble polymer for forming a protective overcoat for a resist film, characterized in that the contact angle of the polymer to water is 90° or above. The polymer is preferably an acrylic polymer which comprises as the essential components constituent units derived from (meth) acrylic acid and constituent units derived from a specific acrylic ester.

6 Claims, No Drawings

MATERIAL FOR FORMING RESIST PROTECTION FILMS AND METHOD FOR RESIST PATTERN FORMATION WITH THE SAME

RELATED APPLICATIONS

This application is the U.S. National Phase filing under 35 U.S.C. §371 of PCT/JP2005/023637, filed Dec. 22, 2005, which designated the United States and was published in a language other than English, which claims priority under 35 U.S.C. §119(a)-(d) to Japanese Patent Application No. 2004-378234, filed Dec. 27, 2004. The content of these applications is incorporated herein by reference in their entireties.

TECHNICAL FIELD

The present invention relates to a material for forming a resist protective film, and a method for forming a resist pattern using the same. Particularly, the present invention relates to a material for forming a resist protective film which can be suitably used in a liquid lithography process by which the resolution of a resist pattern on at least a resist film on a route of allowing lithographic exposure light to reach to the resist film by exposing the above resist film, while being intervened by a liquid having a predetermined thickness and refractive index which is larger than that of an air and smaller than that of the resist film, and to a method for forming a resist pattern using the material.

BACKGROUND ART

Lithography methods have been frequently used for the production of fine features in various kinds of electronic devices, such as semiconductor devices and liquid crystal devices. However, as the device features are further miniaturized, having miniaturized resist patterns in lithography processes will also desirable.

In the advanced field, for example, a lithography process now allows the formation of a fine resist pattern having a line width of about 90 nm. However, finer pattern formation will be required in the future.

For attaining the formation of such a fine pattern having a line width of less than 90 nm, a first step is to develop a lithography device and a corresponding resist. Common factors to consider for developing the lithography device include shortening of the wavelengths of the light source such as an F2 laser, EUV (extreme UV light), electron beam, and X-ray, and increasing the numerical aperture (NA) of the lens.

However, the shortening of the optical wavelength may require a new and more expensive lithography device. In addition, due to an inverse relationship between the resolution and the focal depth width, even if the resolution is increased, a disadvantage occurs at high NA in which focal depth width decreases.

Recently, a method known as a liquid immersion lithography process has been reported (e.g., Non-Patent Documents 1, 2, and 3) as a lithography technology to solve such problems. In this process, a liquid such as purified water or a fluorine-based inert liquid (refractive index liquid, immersion liquid) is placed on a resist film in a predetermined thickness between a lens and the resist film. In this method, the space of the path of exposure light, which is conventionally filled with inert gas such as air or nitrogen, is replaced with a liquid having a higher refractive index (n), for example purified water, to attain high resolution without a decrease in focal depth width, similar to the use of a light source of shorter wavelength or a high NA lens, even if an optical source having the same exposure wavelength is employed.

Such liquid immersion lithography has been given considerable attention because its use allows a lens implemented in the existing device to realize the formation of a resist pattern superior in higher resolution property as well as excellent in focal depth in low costs.

(Non Patent Document 1) Journal of Vacuum Science & Technology B (J. Vac. Sci. Technol. B) (Issued country: U.S.A.), Vol. 17, No. 6, pages 3306-3309, 1999.

(Non Patent Document 2) Journal of Vacuum Science & Technology B (J. Vac. Sci. Technol. B) (Issued country: U.S.A.), Vol. 19, No. 6, pages 2353-2356, 2001.

(Non Patent Document 3) Proceedings of SPIE (Issued country: U.S.A.), Vol. 4691, pages 459-465, 2002.

(Patent Document 1) International Patent Publication No. 2004/074937

DISCLOSURE OF THE INVENTION

Problems to be Solved by the Invention

However, in such a liquid immersion lithography process, the lithography process is carried out while layering intervening a liquid for liquid immersion lithography such as pure water and inert fluorinated (fluorine-based) liquid on the top layer of the resist film, so that it is greatly apprehended that surface defects are generated on the resist pattern. Although much of causes of this surface defect generation remain to be elucidated, in the liquid immersion lithography process with a liquid for liquid immersion lithography layered on the film to be exposed, it is assumed that the interaction between a liquid for liquid immersion lithography and the film to be exposed, a liquid for liquid immersion lithography remaining on the exposed film, and, furthermore, the invasion of a resist film by the above-mentioned liquid for liquid immersion lithography during the liquid immersion lithography process and so on are involved in the cause. Therefore, it is urgently required to suppress the generation of such a surface defect.

In the abovementioned process in which exposure is conducted under conditions where a medium such as purified water is interposed between a lens and a substrate, although the materials used in a conventional lithography process may be utilized without any adjustment, it is suggested to use materials different from those of conventional lithography process.

Among them (Under these circumstances), materials for forming the protective film using a fluorine-containing resin have been proposed for solving the above-mentioned point at issue (Patent Document 1). However, when such a material for forming a protective film is used, though the aforementioned purpose is attained, problems on the investment efficiency are caused such as those due to the necessity for a special cleaning solution and an applying device for it as well as an increase in the number of processes for removing the protective film.

Furthermore, recently, a process of using a water-insoluble and alkali-soluble polymer as a material for forming a protective film on the resist top layer has drawn considerable attention, so that there has been a strong demand for developing protective film-forming materials capable of much more excluding the risk of the above-mentioned surface defect generation.

An objective of the present invention is to provide a technique enabling the application of the resist film obtained from conventional resist compositions, which have required many development resources to the liquid immersion lithography.

More specifically, an object of the present invention is to provide a material for forming a protective film capable of efficiently suppressing the surface defect in liquid immersion lithography process in which a liquid for liquid immersion lithography is placed on the film to be exposed, further more specifically, an object of this invention is to provide a material for forming a protective film capable of easily removing a liquid for liquid immersion lithography attached to the substrate after exposure, smoothly carrying out the exposure of substrate ends, performing a smooth exposure treatment, and causing no change in quality of the resist film due to the above-descried liquid for liquid immersion lithography during the liquid immersion lithography process and no change in the refraction index and so on accompanying the deterioration of the aforementioned liquid itself for liquid immersion lithography due to ingredients eluted from the resist film.

Means for Solving the Problems

For solving the aforementioned problems, a material for forming a resist protective film according to the present invention is a material comprising an alkali-soluble polymer, in which the contact angle of the polymer to water is 90° or above.

Furthermore, a method for forming a resist pattern of the present invention is a method for forming a resist pattern using a liquid immersion lithography process, the method comprising: forming a photoresist film on a substrate; forming a protective film having the properties of being substantially insoluble in water but soluble in alkaline on the resist film; directly placing the liquid for liquid immersion lithography having a predetermined thickness at least on the protective film on the substrate having the resist film and the protective film layered thereon; irradiating the resist film with predetermined patterning light through the liquid for liquid immersion lithography and the protective film, and optionally subjecting the resultant resist film to heat treatment, washing the protective film and the resist film by using alkaline developer solution to remove the protective film, and simultaneously developing the resist film to obtain a resist pattern.

Effects of the Invention

By using the material for forming a protective film according to the present invention, the protective film can be directly formed on the resist film so as not to interfere with the patterning light exposure. In addition, the material for forming the protective film of this invention is insoluble in water so as to enable the use of "water (pure water or deionized water) which is most likely to be the liquid for liquid immersion lithography process because of the optical requirements of liquid immersion lithography, easy handling, and no risk in polluting the environment" as the actual liquid for immersion lithography process. In other words, even when water, which is easy to handle, has an excellent refractive index property and no risk of environmental pollution, is used as immersion liquid for the liquid immersion lithography process, the material of the present invention sufficiently protects resist films of various compositions during the liquid immersion lithography process so that the resist patterns having excellent properties can be obtained. In addition, when the exposure light with a wavelength of 157 nm is used, a fluorine-containing medium is likely to be the liquid for liquid immersion lithography from the viewpoint of the exposure light absorption. Even when such a fluorine-containing solvent is used, as for the water mentioned above, it sufficiently protects the resist film during liquid immersion lithography process so that the resist pattern with excellent properties can be obtained. Furthermore, since the material according to the present invention is alkali-soluble, it is unnecessary to remove the formed protective film from the resist film prior to the development process even when the light exposure is completed reaching the step of development process. That is, by using the protective film obtained using the material according to the present invention, it is unnecessary to set up the step of removing the protective film prior to the development process after exposure such that the development process for the resist film with an alkaline developer solution can be performed as the protective film remains, so that the protective film removal and the resist film development are simultaneously accomplished. Therefore, the method for forming the pattern using the material according to the present invention can efficiently perform the formation of the resist film with an excellent pattern property keeping the environmental pollution risk extremely low and reducing the number of processes.

Furthermore, the contact angle of the material of the present invention to a liquid for liquid immersion lithography placed on the film to be exposed is high, enabling the easy removal of the above-mentioned liquid after exposure, suppressing the risk of the surface defect generation, and allowing smooth exposure of substrate ends.

In addition, the material of the present invention is capable of simultaneously preventing the permeated of a resist film by the liquid for liquid immersion lithography, and the deterioration of the liquid itself, due to eluted components from the resist film.

PREFERRED MODE FOR CARRYING OUT THE INVENTION

The material for forming a resist protective film according to the present invention is a material comprising an alkali-soluble polymeric component, in which the contact angle of the polymeric component to water is 90° or above.

The material according to the present invention has a contact angle of more than 90° to the liquid for immersion lithography process, so that it is low in wettability, and no substantial permeation by a liquid for liquid immersion lithography. The material has substantially no compatibility with water, is soluble in an alkaline, transparent to exposure light, does not promote mixing with a resist film, exhibits good adhesion to a resist film and good compatibility with a developing solution, and is also dense and can prevent permeation of an amine in an atmosphere.

Preferably, the above-described polymeric component is an acrylic polymer. It is considered necessary for a protective film for liquid immersion lithography to have an additional characteristic in which a contact angle thereof to a liquid for liquid immersion lithography is higher than a predetermined value. Since a film formed using the aforementioned acrylic polymer has a contact angle of more than 90° to water, not only is the film low in wettability, and no substantial permeation by a liquid for liquid immersion lithography as described above, but also the amount of liquid for liquid immersion lithography adhering to the resist film is reduced; so that the time required for cleaning after the completion of liquid immersion lithography process is shortened, the unnecessary leakage of the liquid for liquid immersion lithography to the outside is decreased, and allowing the exposure of substrate ends to be carried out smoothly, so as to be economically advantageous.

Since the aforementioned contact angle is more than 90°, the liquid for liquid immersion lithography is appropriately hydrophobically repelled when placed on the protective film, allowing the prevention of a decrease in physical stability as a liquid for liquid immersion lithography.

"Alkali-soluble polymer" preferably comprises (meth) acrylic acid constituent units and acrylic ester constituent units represented by the general formula (1):

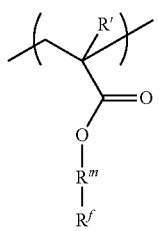

(1)

in which R' is selected from a hydrogen atom, a methyl group, a hydroxyalkyl group having 1 to 4 carbon atoms. $R^m$ is a linear or branched alkylene group having 1 to 5 carbon atoms. $R^f$ is a hydrogen atom, or an alkyl group having 1 to 15 carbon atoms a portion or all of hydrogen atoms thereof are substituted with a fluorine atom.

$R^m$ includes linear an alkylene group such as a methylene group, a n-ethylene group, a n-propylene group, a n-butylene group, a n-pentylene group; a branched alkylene group such as a 1-methylethylene group, a 1-methylpropylene group, a 2-methylpropylene group. Among them, a methylene group and a n-ethylene group are preferable.

$R^f$ includes a lower alkyl group in which a portion or all of hydrogen atoms thereof are substituted with a fluorine atom. Specific examples include a trifluoromethyl group, a pentafluoroethyl group, a heptafluoropropyl group, a nonafluoro butyl group, an undecafluoropropyl group, a heptadecafluorooctyl group. Among them, in terms of improving contacting property, a heptadecafluorooctyl group is preferable.

In terms of exhibiting good water resistance, providing membranes with appropriate flexibility, and improving transparency, the acrylic polymer preferably comprises the (meth) acrylic acid constituent units, the constituent units represented by the general formula (1) and at least one of acrylic ester constituent units as a third constituent unit represented by the general formula (2):

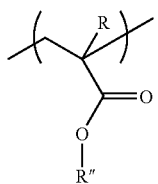

(2)

in which R is a hydrogen atom or a methyl group, and R" is an alicyclic hydrocarbon group having 4 to 15 carbon atoms.

In the general formula (2), the third constituent unit comprises at least two constituent units in which R" is selected from $R''^a$ and $R''^b$, and $R''^a$ is a polycyclic hydrocarbon group, and $R''^b$ is a monocyclic hydrocarbon group. By introducing a polycyclic hydrocarbon group and a monocyclic hydrocarbon group, water resistance and transparency is improved, and it is possible to provide membranes with appropriate flexibility by introducing a chain hydrocarbon group.

The polycyclic hydrocarbon group preferably includes at least one hydrocarbon group selected from the group consisting of a dicyclopentanyl group, an adamantyl group, a norbonyl group, an isobornyl group, a tricyclodecyl group and a tetracyclododecyl group.

The monocyclic hydrocarbon group preferably includes at least one hydrocarbon group selected from the group consisting of a cyclohexyl group, a cyclopentyl group and a cycloheptyl group.

The acrylic polymer comprises the (meth) acrylic acid constituent units, the constituent units represented by the general formula (1), the constituent units represented by the general formula (2) and at least one of acrylic ester constituent units as a fourth constituent unit, represented by the general formula (3):

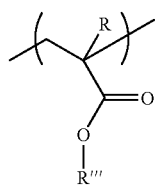

(3)

in which R'" is a chain hydrocarbon group.

The chain hydrocarbon group is preferably at least one hydrocarbon group selected from a n-butyl group, a n-pentyl group, a 2-ethylhexyl group, and a n-hexyl group.

The acrylic polymer is preferably represented by the general formula (4) below. This acrylic polymer is capable of improving water resistance and transparency, and providing membranes with appropriate flexibility, because a polycyclic hydrocarbon group, a monocyclic hydrocarbon group and a chain hydrocarbon group are added.

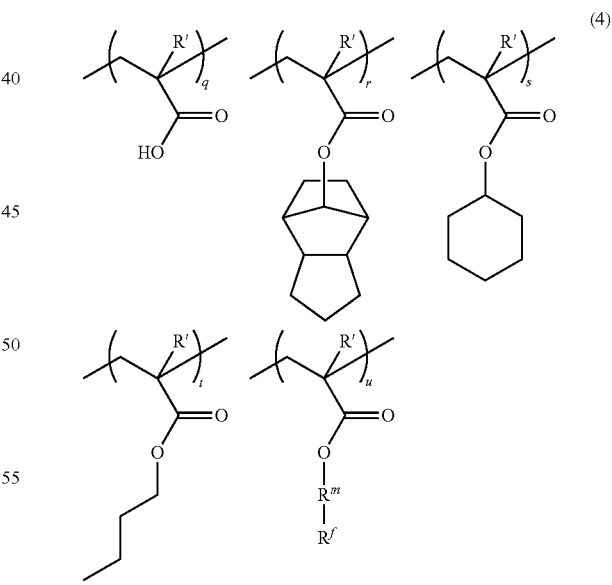

(4)

In the general formula (4), q, r, s, t, and u each representing mol % of the constituent unit in the polymer, are 2 to 60 mol %.

The abovementioned acrylic polymer may be synthesized according to known acryl polymer polymerization methods. The mass average molecular weights of resins of polymer components (by GPC, polystyrene conversion) is preferably in the range of 5,000 to 80,000, and more preferably 8,000 to 50,000, but not particularly limited to such a range.

The polymer is soluble in an alcoholic solvent, can form a film by a spin coater, causes neither swelling nor thickness loss to pure water within a time sufficient for liquid immersion lithography, and is also soluble in an alkaline developing solution. That is, the polymer is highly suited for use as a resist protective film material for liquid immersion lithography. Moreover, the polymer has a high refractive index of 1.65, when permeated by light having a wavelength of 193 nm.

The protective film of the present invention further comprises a solvent. The solvent needs to dissolve the acrylic polymer.

As the solvent which dissolves the acrylic polymer, any solvent that dissolves the polymer can be used. Examples of such a solvent include alcoholic solvent, paraffinic solvent and fluorine-based solvent. As the alcoholic solvent, a common alcoholic solvent such as isopropyl alcohol, 1-hexanol, 2-methyl-1-propanol or 4-methyl-2-pentanol can be used, and 2-methyl-1-propanol and 4-methyl-2-pentanol are particularly preferable. It has been confirmed that n-heptane can be used as a paraffinic solvent and perfluoro-2-butyltetrahydrofuran can be used as a fluorine-based solvent. Among these solvents, an alcoholic solvent is preferable in view of alkaline solubility upon development.

The material of the present invention can further comprise a crosslinking agent and an acidic compound.

The crosslinking agent, which is soluble in the solvent, can be used. Particularly, a nitrogen-containing compound having an amino group and/or an imino group, each of which is substituted with a group selected from a hydroxyalkyl group and an alkoxyalkyl group, can be preferably used.

As the nitrogen-containing compound, at least one selected from a melamine derivative, a guanamine derivative, a glycoluril derivative, a succinylamide derivative, and a urea derivative is preferably used.

Specifically, these nitrogen-containing compounds can be obtained, for example, by methylolating the melamine-based compound, urea-based compound, guanamine-based compound, acetoguanamine-based compound, benzoguanamine-based compound, glycoluril-based compound, succinylamide-based compound or ethyleneurea-based compound through a reaction with formalin in boiling water, and optionally further alkoxylating the reaction product through a reaction with a lower alcohol, for example, methanol, ethanol, n-propanol, isopropanol, n-butanol or isobutanol.

As the crosslinking agent, tetrabutoxymethylated glycoluril is more preferably used.

Furthermore, as the crosslinking agent, a condensation reaction product of a hydrocarbon compound substituted with a group selected from at least one of a hydroxyl group and a alkyloxy group; and a monohydroxymonocarboxylic acid compound can also be preferably used.

The monohydroxymonocarboxylic acid is preferably monohydroxymonocarboxylic acid in which a hydroxyl group and a carboxyl group are respectively bonded with the same carbon atom, or adjacent two carbon atoms.

In addition, acidic components (desirably, fluorocarbon compounds) can be added to the material of the present invention. Such acidic components preferably are capable of stabilizing against post exposure delay.

The fluorocarbon compound which exerts the above action, shown below, is not an object of Significant New Use Rule (SNUR) and is a usable chemical substance.

Such a fluorocarbon compound is preferably a fluorocarbon compound represented by the following general formula (5):

$$(C_nF_{2n+1}SO_2)_2NH \quad (5)$$

wherein n represents an integer of 1 to 5;
a fluorocarbon compound represented by the following general formula (6):

$$C_mF_{2m+1}COOH \quad (6)$$

wherein m represents an integer of 10 to 15;
a fluorocarbon compound represented by the following general formula (7):

$$(7)$$

wherein o represents an integer of 2 to 3; and
a fluorocarbon compound represented by the following general formula (8):

$$(8)$$

wherein p represents an integer of 2 to 3; and $R^a$ represents an alkyl group in which a portion or all of hydrogen atoms thereof are substituted with fluorine atoms, and may be substituted with a group selected from a hydroxyl group, an alkoxy group, a carboxyl group or an amino group.

Specifically, the fluorocarbon compound represented by the general formula (5) is preferably a compound represented by the following chemical formula (9):

$$(C_4F_9SO_2)_2NH \quad (9)$$

or a fluorocarbon compound represented by the following chemical formula (10):

$$(C_3F_7SO_2)_2NH \quad (10)$$

Specifically, the fluorocarbon compound represented by the general formula (6) is preferably a fluorocarbon compound represented by the following chemical formula (11):

$$C_{10}F_{21}COOH \quad (11)$$

Specifically, the fluorocarbon compound represented by the general formula (7) is preferably a fluorocarbon compound represented by the following chemical formula (12):

$$(12)$$

Specifically, the fluorocarbon compound represented by the general formula (8) is preferably a fluorocarbon compound represented by the following chemical formula (13):

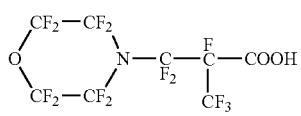

(13)

The liquid immersion lithography process preferably have a construction by which the resolution of a resist pattern on at least a resist film on a route of allowing lithographic exposure light to reach to the resist film by exposing the above resist film, while being intervened by a liquid for liquid immersion lithography process.

The exposure light for exposing the resist film preferably has a dominant wavelength which is at least one selected from 157 nm 193 nm and 248 nm.

In the present invention with the above constitution, liquid immersion lithography can be conducted by using, as a liquid for liquid immersion lithography, water composed substantially of pure water or deionized water, or a fluorine-based inert liquid. As described previously, taking into account the cost, the ease of post-treatment and the reduction in environmental pollution, water is a more preferable liquid for liquid immersion lithography. When exposure light having a wavelength of 157 nm is used, it is preferable to use a fluorine-based solvent which causes less absorption of exposure light. Furthermore, the protective film formed from the material of the present invention is dense, can suppress permeation of a resist film by a liquid immersion medium, and also can prevent permeation an amine component in an atmosphere, thereby imparting "the resistance to post exposure delay" required for the resist film.

The resist film, which can be used in the present invention, may be any resist film obtained by using a conventional common resist composition, and is not specifically limited. This is also a primary feature of the present invention.

The protective film of the present invention is nonaqueous and also exhibits high resistance to the other immersion liquids, and therefore can be applied to a resist film with any composition, including a resist film having low resistance to an immersion liquid. Therefore, as the resist film material of the present invention, any known resist can be used and a common positive photoresist and a negative photoresist can be used.

A resist pattern forming method for liquid immersion lithography using the protective film of the present invention will now be described.

First, a common resist composition is coated onto a substrate such as silicone wafer using a spinner and then prebaked (PAB treatment).

An organic or inorganic antireflective film can be provided between a substrate and a coating layer of a resist composition, to form a two-layered laminate.

The above processes can be conducted by a known method. It is preferable that the operation conditions are appropriately set according to the composition and characteristics of a resist composition used.

Next, the resist protective film is formed by uniformly coating a material composition for forming a resist protective film of the present invention, such as a composition represented by the chemical formula (4) on the surface of a resist film (single layer, plural layers), followed by curing.

On the substrate, on which a resist film covered with the protective film is formed, liquid for immersion liquid exposure (e.g., pure water, deionized water, fluorine-based solvent or a silica-based solvent) is disposed.

The resist film on the substrate in an immersed state is selectively exposed via a desired mask pattern. Accordingly, exposure light penetrates into the refractive index liquid and protective film, reaching the resist film at this time.

At this time, the resist film is completely shut off from the refractive index liquids such as pure water, by the protective film, and thus deterioration such as swelling is not caused by permeation of the refractive index liquid. In addition, the optical characteristics such as the refractive index of the refractive index liquid do not deteriorate as a result of dissociation of a component in the liquid for immersion liquid exposure.

The wavelength of light used in the exposure is not specifically limited, and the exposure can be conducted by using radiation such as that of an ArF excimer laser, KrF excimer laser, $F_2$ excimer laser, EUV (extreme ultraviolet ray), VUV (vacuum ultraviolet ray), electron beam, X-ray and soft X-ray. The kind of radiation is mainly decided according to characteristics of a resist film.

As described above, in the resist pattern forming method of the present invention, the liquid for immersion liquid exposure is disposed onto the resist film via a protective film upon exposure. During this operation, the resist film is permeated by being brought into contact with the liquid. However, this permeation can be prevented by using the protective film of the present invention. Examples of such a liquid include water (pure water, deionized water), or a fluorine-based inert liquid. Specific examples of the fluorine-based inert liquid include liquids containing fluorine-based compounds such as $C_3HCl_2F_5$, $C_4F_9OCH_3$, $C_4F_9OC_2H_5$ and $C_5H_3F_7$ as main components. Among these liquids, in view of cost, safety, environmental problems and general-purpose properties, the use of water (pure water or deionized water) is preferred. When using exposure light having a wavelength of 157 nm, a fluorine-based solvent is preferably used in view of less absorption of exposure light.

The refractive index of the liquid used is not specifically limited as long as it is within range "which is larger than the refractive index of an air and smaller than that of a resist composition used".

After the exposure process in liquid immersion is completed, the substrate is removed from the liquid, and the liquid is removed from the substrate. Although this operation is followed by a development process using an alkaline developing solution, before the development process, curing of the exposed area is promoted by heating the resist film. If the resist film is permeated by an amine in an atmosphere component during this process, a pattern shape after the development process drastically deteriorates. However, in the present invention, since the protective film is densified, the amine in an atmosphere component does not permeate the resist film.

As described above, the resist film is subjected to PEB (post exposure bake) without removing the protective film on the exposed resist film, and then developed using an alkaline developing solution composed of an aqueous alkaline solution. The developing solution used in this development treatment is alkaline, and therefore, the protective film is dissolved and discharged; and then the soluble portion of the resist film is dissolved and discharged. The development treatment may be followed by postbaking. Preferably, rinsing is conducted using pure water. In the water rinsing process, water is dripped or sprayed over the surface of the substrate while rotating, thereby washing away the protective film component and the resist composition dissolved by the developing solution, and the developing solution on the substrate. Then, a resist pattern, in which a resist film is patterned in a shape corresponding to a mask pattern, is obtained by drying. As described above, in the present invention, removal of the protective film and the development of the resist film are simultaneously achieved by a single development process. By forming resist patterns in this way, resist patterns having fine line widths, particularly line-and-space patterns having a small pitch can be produced with good resolution. Here, the term "pitch" in line-and-space patterns refers to a total distance of a resist pattern width and a space width in the line width direction of pattern.

EXAMPLES

Hereinafter, examples of the present invention will be described. However, these examples are only provided for appropriately illustrating the present invention and do not intend to restrict the present invention at all.

Manufacturing Example

Manufacture of a copolymer used as material for forming resist protective film of the present invention 750 g of isobutyl alcohol was placed into a 2-liter four necked flask equipped with a reflux condenser and a stirrer, and a flow of nitrogen was started. After the temperature was raised to 80° C. while stirring, a mixture of methacrylic acid-based monomers containing acrylic acid (60 g), dicyclopentanyl methacrylate (40 g), n-butyl acrylate (40 g), cyclohexyl methacrylate (20 g) and heptadecafluorodecyl methacrylate (40 g); and another mixture of isobutyl alcohol (50 g) as a solvent, and benzoyl peroxide (1.7 g) as a polymerization initiator were dripped into the flask from separate dripping nozzles respectively over 4 hours. The dripping was carried out continuously while maintaining a constant drip rate for each ingredient throughout the dripping.

After the dripping was completed, the polymerization reaction solution was left to react for 4 hours at 80° C., and again for an additional 1 hour by raising the temperature until reflux of the solvent was observed. Thus, the polymerization reaction was completed, obtaining a copolymer shown by the following chemical formula (14).

The solid component concentration in the polymerization reaction solution thus obtained was 20.2%, and the weight-average molecular weight (Mw) thereof converted into polystyrene was 20,000.

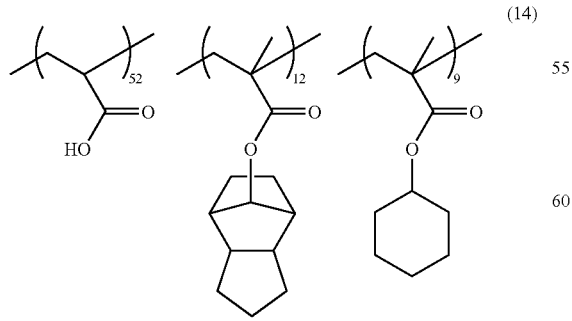

(14)

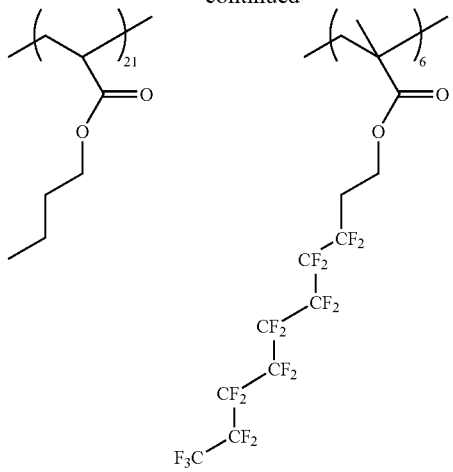

Example 1

The following resin component, acid generator, and nitrogen-containing organic compound were uniformly dissolved in an organic solvent to prepare a resist composition.

As the resin component, 100 parts by mass of a copolymer including a constituent unit represented by the following chemical formula (15) was used. The contents of the respective constituent units f, g and h used in the preparation of the resin component were respectively 40 mol %, 40 mol % and 20 mol %.

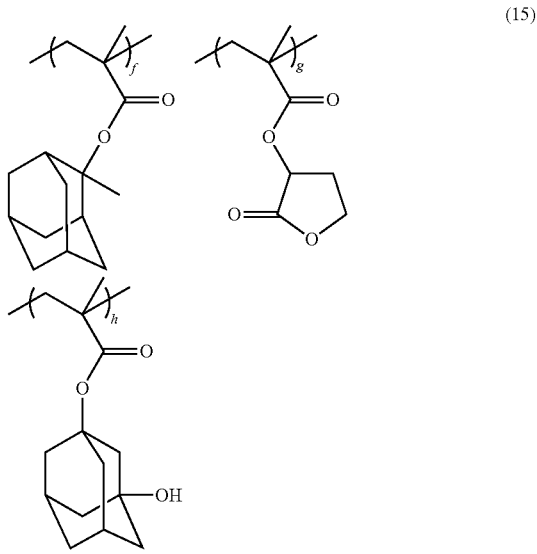

(15)

As the acid generator, 2.0 parts by mass of triphenylsulfonium nonafluorobutanesulfonate and 0.8 parts by mass of tri(tert-butylphenyl)sulfonium trifluoromethanesulfonate were used.

A mixed solvent of propylene glycol monomethyl ether and propylene glycol monomethyl ether acetate (mixing ratio: 6:4) was used as the organic solvent, to prepare 7.0% resist aqueous solution. As the nitrogen-containing organic compound, 0.25 parts by mass of triethanolamine was used. As the additive, 25 parts by mass of γ-butyrolactone was added.

Using the resist composition thus prepared, a resist pattern was formed. First, an organic antireflective film composition "ARC29" (trade name, manufactured by Brewer Co.) was coated on a silicone wafer using a spinner and then dried by baking on a hot plate at 205° C. for 60 seconds to form an organic antireflective film having a thickness of 77 nm. Subsequently, the resist composition was coated on this antireflective film using a spinner and dried by prebaking on a hot plate at 130° C. for 90 seconds to form a resist film having a thickness of 225 nm on the antireflective film.

The copolymer obtained in the manufacturing example, represented by the chemical formula (14), was dissolved in 2-methyl-1-propylalcohol, and the resin concentration was 2.5% by mass, was spin-coated on the resist film, and then heated at 90° C. for 60 seconds to form a protective film having a thickness of 70 nm.

Next, the resist film was irradiated with pattern light (exposure) through a mask pattern by an liquid immersion lithography apparatus AS3-IML (manufactured by Canon Corporation) UV light (wavelength: 193 nm). In this liquid immersion lithography process, 8 inch silicon wafer was used to form line-and-space of 130 nm.

After forming the pattern, PEB treatment was carried out at 115° C. for 90 seconds. Then, without removing the protective film, the film was developed using an alkaline developing solution at 23° C. for 60 seconds. As the alkaline developing solution, an aqueous 2.38% by mass tetramethylammonium hydroxide solution was used. The protective film was completely removed by this development process and the development of the resist film could be satisfactorily realized, and line-and-space of 130 nm could be formed.

A KLA measurement was performed on the pattern thus obtained with a patterning defect measuring apparatus (KLA Tencor Corporation: KLA) to observe the pattern defect. The number of pattern defects specific to liquid immersion lithography process represented by bridges, etc. was measured three times respectively to obtain a mean value thereof. The results thus obtained are shown in the following Table 1 as a ratio to 100 defects obtained in the comparative example 1 described below.

Example 2

Using entirely the same procedure as the aforementioned Example 1, except that a composition containing a copolymer obtained in Manufacturing Example 1 shown in the above-described chemical formula (14) and 0.7% by mass (CF2)3 (SO2)2NH based on the copolymer was used as the material for forming a protective film whose solid component concentration by mass was adjusted to 2.5% by mass, the number of pattern defects represented by bridges, etc. was measured three times respectively to obtain mean values thereof.

Results obtained are shown in the following Table 1 as ratios relative to 100 defects obtained in the comparative example 1 described below.

Example 3

Using entirely the same procedure as the aforementioned Example 1, except that a composition containing a copolymer obtained in Manufacturing Example 1 shown in the above-described chemical formula (14) and 0.7% by mass (CF2)3 (SO2)2NH based on the copolymer and 0.7% by mass tetrabutoxymethylated glycoluryl based on the copolymer was used as the material for forming a protective film whose solid component concentration by mass was adjusted to 2.5% by mass, the number of pattern defects represented by bridges, etc. was measured three times respectively to obtain mean values thereof. Results obtained are shown in the following Table 1.

Comparative Example 1

Using entirely the same procedure as in the aforementioned Example 1, except that no protective film was formed on the resist film, the number of pattern defects represented by bridges, etc. was measured three times respectively to obtain mean values thereof. Results obtained are shown in the following Table 1 as ratios relative to 100 defects obtained in the comparative example 1 described below.

TABLE 1

| | Number of pattern defects | | |
|---|---|---|---|
| | Protective film | Number of Bridge defects (%) | Total number of defects (%) |
| Example 1 | present | 35 | 61 |
| Example 2 | present | 41 | 69 |
| Example 3 | present | 23 | 57 |
| Comparative Example 1 | absent | 100 | 100 |

As clearly seen from the above-described Table 1, it was observed that when the material of the present invention was used, the number of pattern defects specific to the liquid immersion lithography process represented by bridge defects, etc. was reduced to less than about 40%, as compared to the number of defects observed when the material in the present invention was not used.

As described above, according to the present invention, even if a resist film is formed using a common resist composition, it is possible to obtain a material for forming the protective film which is capable of simultaneously preventing the permeated of a resist film by the liquid for liquid immersion lithography, regardless of the type of the liquid for immersion liquid used, and particularly water or a fluorine-based inert liquid used in a liquid immersion lithography process. Consequently, when using a protective film of the present invention, a resist pattern can be effectively formed using a liquid immersion lithography process.

The invention claimed is:

1. A material for forming a resist protective film provided on a resist film, the material comprising an alkali-soluble acrylic polymer, represented by general formula (4) below:

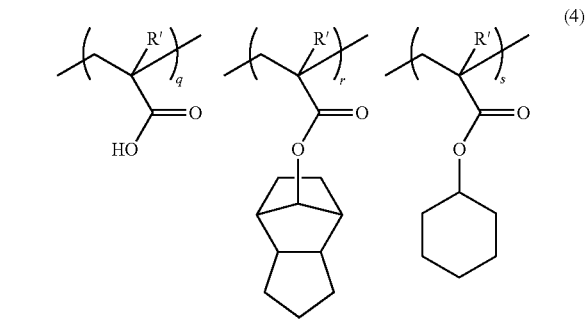

-continued

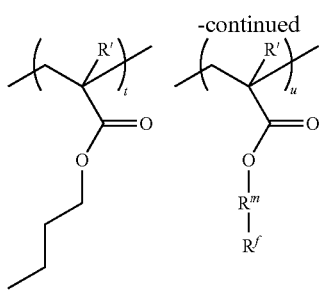

wherein R' is a hydrogen atom, a methyl group, or a hydroxyalkyl group having 1 to 4 carbon atoms, $R^m$ is a linear or branched alkylene group having 1 to 5 carbon atoms, and $R^f$ is an alkyl group having 1 to 15 carbon atoms, a portion or all of hydrogen atoms thereof being substituted with fluorine atoms wherein q, r, s, t, and u each representing mol % of the constituent unit in the polymer, are 2 to 60 mol %.

2. The material according to claim 1, wherein the resist film is used for a liquid immersion lithography process.

3. The material for forming a resist protective film provided on a resist film according to claim 1, further comprising an alcoholic solvent.

4. The material for forming a resist protective film provided on a resist film according to claim 1, further comprising a crosslinking agent which is a nitrogen-containing compound having at least one substituent selected from the group consisting of an amino group and an imino group, each of which is substituted with a group selected from the group consisting of a hydroxyalkyl group and an alkoxyalkyl group.

5. The material for forming a resist protective film provided on a resist film according to claim 1, wherein the resist film is used for a liquid immersion lithography process, and wherein the liquid immersion lithography process has a construction by which the resolution of a resist pattern on at least a resist film on a route of allowing lithographic exposure light to reach to the resist film by exposing the resist film, while being intervened by a liquid for liquid immersion lithography having a predetermined thickness, which has a refractive index larger than that of an air and smaller than that of the resist film.

6. A method for forming a resist pattern using a liquid immersion lithography process, the method comprising:
forming a photoresist film on a substrate; forming a protective film on the resist film by using a material comprising an alkali-soluble acrylic polymer, wherein the acrylic polymer comprises (meth)acrylic acid constituent units, acrylic ester constituent units represented by the general formula (1), and at least one acrylic ester constituent unit represented by the general formula (2):

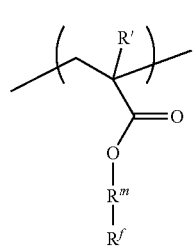

(1)

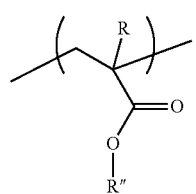

(2)

wherein R' is a hydrogen atom, a methyl group, or a hydroxyalkyl group having 1 to 4 carbon atoms, $R^m$ is a linear or branched alkylene group having 1 to 5 carbon atoms, and $R^f$ is an alkyl group having 1 to 15 carbon atoms, a portion or all of hydrogen atoms thereof being substituted with fluorine atoms, R is a hydrogen atom or a methyl group, and R" is an alicyclic hydrocarbon group having 4 to 15 carbon atoms, and wherein the contact angle of the polymeric component to water is 90° or above;

directly placing the liquid for liquid immersion lithography having a predetermined thickness at least on the protective film on the substrate having the resist film and the protective film layered thereon;

irradiating the resist film with predetermined patterning light through the liquid and the protective film, and optionally subjecting the resultant resist film to heat treatment;

washing the protective film and the resist film by using alkaline developer solution to remove the protective film; and simultaneously developing the resist film to obtain a resist pattern.

* * * * *